United States Patent [19]
Tachi et al.

[11] Patent Number: 4,992,136
[45] Date of Patent: Feb. 12, 1991

[54] DRY ETCHING METHOD

[75] Inventors: Shinichi Tachi, Sayama; Kazunori Tsujimoto, Higashiyamato; Sadayuki Okudaira, Ome, all of Japan

[73] Assignee: Hitachi, Ltd., Tokyo, Japan

[21] Appl. No.: 223,570

[22] Filed: Jul. 25, 1988

[30] Foreign Application Priority Data

Jul. 29, 1987 [JP] Japan .................. 62-187549

[51] Int. Cl.$^5$ .................. C03C 15/00; C23F 1/00
[52] U.S. Cl. .................. 156/643; 156/646; 156/656; 156/657; 156/659.1; 156/662; 156/664; 156/665
[58] Field of Search .......... 156/646, 643, 657, 656, 156/662, 659.1, 665, 664; 204/192.37, 192.35

[56] References Cited

U.S. PATENT DOCUMENTS

| | | | |
|---|---|---|---|
| 4,264,409 | 4/1981 | Forget et al. | 156/643 |
| 4,615,764 | 10/1986 | Bobbio et al. | 156/646 X |
| 4,666,555 | 5/1987 | Tsang | 156/646 X |
| 4,678,540 | 7/1987 | Uchimura | 156/646 X |
| 4,726,879 | 2/1988 | Bondur et al. | 156/646 X |
| 4,734,157 | 3/1988 | Carbaugh et al. | 156/646 X |
| 4,741,799 | 5/1988 | Chen et al. | 156/646 X |

FOREIGN PATENT DOCUMENTS 60-158627 8/1985 Japan .

Primary Examiner—David A. Simmons
Assistant Examiner—Thi Dang
Attorney, Agent, or Firm—Antonelli, Terry, Stout & Kraus

[57] ABSTRACT

An article to be etched is contacted with a plasma of a mixed gas containing an etching gas and a film forming gas or a surface modification gas at a low temperature to effect the dry etching of the article, whereby the selectivity of etching can be made very high and the inclination angle of the side wall of pattern can be controlled at a desired level.

9 Claims, 1 Drawing Sheet

DRY ETCHING METHOD

BACKGROUND OF THE INVENTION

The present invention relates to a dry etching method and more particularly to a low temperature dry etching method capable of controlling the sectional shape of etched article and achieving a high etching selectivity.

The low temperature etching method wherein etching is effected by maintaining the temperature of a semiconductor substrate to be etched at 0° C. or below (which is far lower than used conventionally), is described in, for example, Japanese Patent Application Kokai (Laid-Open) No. 158627/1985.

The above prior art describes that side etching can be made very small by etching silicon at low temperatures. However, it makes no mention as to the improvement of etching selectivity or the control of sectional shape of etched article. Therefore, effecting etching by simply reducing the temperature of a semiconductor substrate to be etched has heretofore made it difficult to carry out the patterning of a multilayered film at a high precision to form fine holes having a sectional shape suitable for filling.

SUMMARY OF THE INVENTION

The object of the present invention is to provide a low temperature dry etching method which solves the above-mentioned problems of the prior art and which can achieve a high etching selectivity and control the sectional shape of etched article at a high precision.

In the present invention, in order to achieve the above object, there is introduced into a reaction chamber, together with an etching gas, a gas which contains a film forming element (e.g. C or Si) and can form, at the time of etching, a film on the surface of a semiconductor substrate to be etched (the gas is hereinafter referred to as "film forming gas"), or a gas of a compound which contains an element (e.g. O or N) capable of reaction with the surface of a semiconductor substrate to be etched to form a reaction product layer on the surface (the gas is hereinafter referred to as "surface modification gas"), whereby the above semiconductor substrate is dry-etched.

DETAILED DESCRIPTION OF THE PREFERRED EMBODIMENTS

Figure 1:
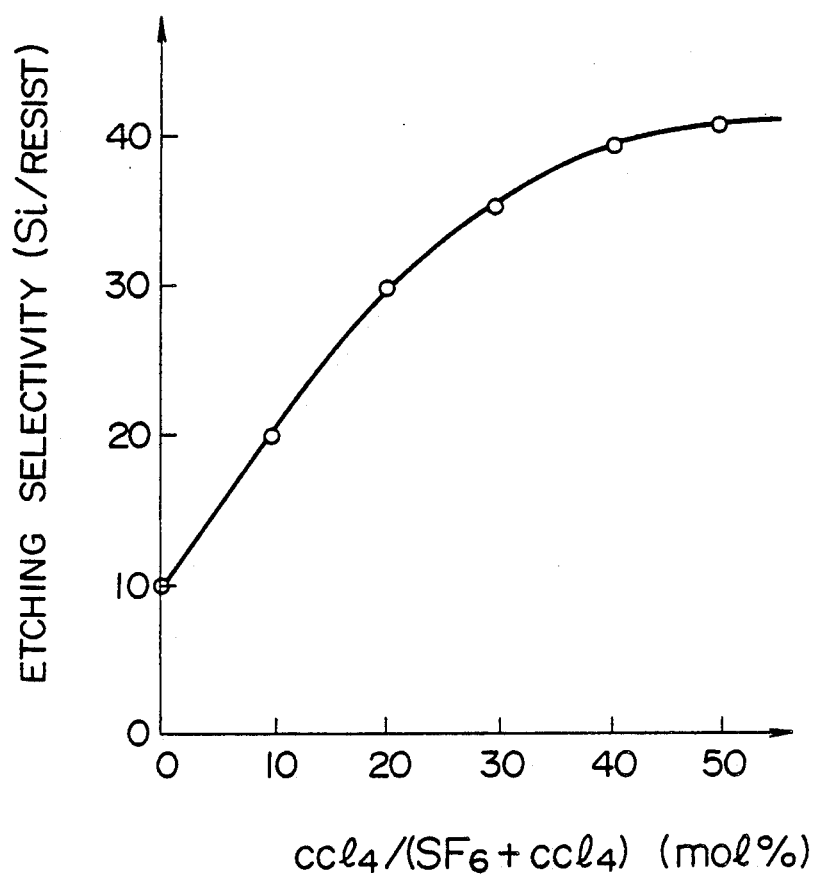
FIG. 1 is a graph showing the relationship between (a) the mixing ratio of $CCl_4$ and $SF_6$ and (b) the etching selectivity of Si/resist when Si was etched using a mixed gas of $CCl_4$ and $SF_6$ with a resist film used as a mask.

In dry etching, when there is used, as a source gas for plasma, a mixed gas consisting of (a) an etching gas such as $Cl_2$, $SF_6$ or the like and (b) a gas of a halogen compound containing an element such as C, Si or the like capable of deposition on the surface of a semiconductor substrate at the time of etching to form a film thereon or a gas of a compound containing an element such as O, N or the like capable of reaction with the surface of the substrate to form a reaction product and change the properties of the surface, there take place simultaneously (1) the etching of the substrate by an etchant contained in the plasma such as F or the like and (2) the deposition of C, Si or the like on the substrate surface or the formation of an oxide layer by O or of a nitride layer by N on the substrate surface. In the side wall of the semiconductor substrate, in particular, a deposition effect or a modification phenomenon tends to appear as a result of anisotropic etching; hence, taper etching can be materialized by controlling the proportion of the gas (a) and the gas (b) and thereby the inclination of the side wall can be set at a desired level. In the reaction of the horizontal surface of the substrate, the etching rate of the resist film (mask) is substantially decreased because the temperature of the semiconductor substrate is maintained very low; consequently, etching of very high selectivity is realized

EXAMPLE 1

A semiconductor substrate was placed in the reaction chamber of a well known parallel plate plasma etching system (ordinarily referred to as "reactive ion etching system") and cooled to $-100°$ C. The polysilicon film formed on the semiconductor substrate was etched using a mixed gas consisting of $CCl_4$ (a film forming gas) and $SF_6$ (an etching gas), with a photoresist film used as a mask. FIG. 1 is a graph showing the relationship between (a) the mixing ratio of $SF_6$ and $CCl_4$ and (b) the selectivity of the polysilicon to the resist film (AZ1350J). As is appreciated from FIG. 1, the selectivity is very high (30 or above) when the $CCl_4$ content in the mixed gas consisting of $SF_6$ and $CCl_4$ is 20 mol % or above [%: mol percent to $(SF_6+CCl_4)$]. The mixed gas was very effective for the etching of the polysilicon film formed on the portions of high level difference, and good etching could be effected Besides the above $CCl_4$, at least one member selected from carbon or silicon halides or hydrides such as $CF_4$, $CHF_3$, $CHCl_3$, $SiF_4$, $SiCl_4$ and the like was suitable as a gas to be mixed with $SF_6$. Thus, a very high selectivity can be obtained by effecting low temperature etching by the use of a mixed gas consisting of an etching gas and a film forming gas containing C or Si. $Cl_2$ or $Br_2$ can also be used as an etching gas in place of $SF_6$.

Similar dry etching of high selectivity can be effected by adding a $CO_2$ gas or a $NH_3$ gas to $SF_6$ in an amount of 5-30 mol %.

EXAMPLE 2

In selectively etching Al at a high selectivity, there is suitably used a low temperature etching method using a mixed gas consisting of a non-film-forming $Cl_2$ gas and a film forming gas such as $CCl_4$, $SiCl_4$ or the like.

Very good results were obtained by adopting a mixing proportion of $CCl_4$ or $SiCl_4$ to $Cl_2$, of 5-40 mol % and an etching temperature of 0° to $-30°$ C. In effecting the high selectivity etching of a W or Mo film at $-10°$ C. to 0° C., the use of a mixed gas consisting of $SF_6$ and 5-30 mol % of a film forming gas (e.g. $CCl_4$) or a surface modification gas (e.g. $NH_3$) was found to be sufficient. In both cases, a selectively of W or Mo to photoresist, of 30 or above was obtained, and the W or Mo film could be etched selectively.

Thus, high selectivity etching can be materialized in low temperature etching by mixing an etching gas (e.g. $SF_6$) with 5-40 mol % of a film forming gas (e.g. $CCl_4$) or a surface modification gas (e.g. $O_2$, $NH_3$).

The present invention can be applied not only to the etching of the above materials but also to the etching of various other materials used in semiconductor devices, such as $SiO_2$, $Si_3N_4$, Mo, single-crystal silicon, gallium arsenide and the like. The present invention was effected not only in the above-mentioned parallel plate plasma etching system but also in a microwave plasma etching system and a magnetron plasma etching system, and excellent results were obtained in all the cases.

EXAMPLE 3

The taper etching of a polysilicon could be effected by etching a polysilicon film at a low temperature of $-100°$ C. using a mixed gas consisting of a $SF_6$ gas and a $CHF_3$ gas. The suitable mixing ratio of $CHF_3$ to $SF_6$ was 3–20 mol %. When the mixing ratio of $CHF_3$ was changed, the taper angle of the side wall of the polysilicon film was changed also. That is, by changing the addition amount of $CHF_3$ (a film forming gas), not only the selectivity but also the taper angle could be changed. In the present method, the dimension of the pattern obtained was not smaller than the dimension of the mask used, and the dimensional precision of the pattern was higher than in the conventional etching methods.

The above low temperature taper etching using a mixed gas consisting of an etching gas and a film forming gas is applicable also to films of materials other than the polysilicon, i.e. Al, $SiO_2$, W, tungsten silicide, molybdenum silicide and single-crystal silicon. In fact, high selectivity (30 or above) and taper etching could be materialized by conducting low temperature etching using, as a plasma gas, a mixed gas consisting of at least two gases, one of them being a non-film-forming etching gas and the other being a film forming gas.

The present invention enables high selectivity etching and taper etching and accordingly is suited for patterning of high level difference and for processing of high aspect ratio, whereby filling of holes becomes easier and incidence of defectives such as disconnection due to overetching is reduced remarkably. Thus, the present invention provides a very advantageous effect in production of semiconductor devices.

In the present invention, the combination and mixing ratio of an etching gas and a film forming gas or a surface modification gas are selected appropriately depending upon the type of a material to be etched and the purpose of etching.

For instance, in the etching of W at a high etching selectivity, etching was conducted using a mixed gas comprising of $SF_6$ and 5–40 mol % of $CCl_4$ or $NH_3$, and there was obtained an etching rate of at least 30 times larger than that of the photoresist film or the $SiO_2$ film at a temperature (of W) of 0° to 20° C. In the etching of a polysilicon film or a single-crystal silicon substrate using a photoresist film as a mask, etching was conducted using a mixed gas consisting of $SF_6$ and at least 20 mol % of $CCl_4$, and there was obtained a very high etching selectivity of 30 or above at temperatures of $-30°$ to $-140°$ C. Appropriately same results were obtained also in cases of tungsten silicide and molybdenum silicide In taper etching, the inclination angle of the side wall of the pattern obtained can be changed by changing the component ratio of the mixed gas used. For instance, when a polysilicon film or a single-crystal silicon substrate is taper-etched using a $SF_6$-$CHF_3$ mixed gas, the inclination angle (against a horizontal plane) of the side wall of the pattern obtained can be changed between 75° and 60° by changing the $CHF_3$ content between 15 and 20 mol %. Therefore, a pattern whose side wall has a desired inclination angle can be obtained by appropriately controlling the component ratio of the mixed gas used. This is effective for, for example, the prevention of disconnection caused by a big level difference.

In the present invention, the temperature of the article to be etched is important and no sufficient effect can be obtained when the etching of the present invention is effected at a relatively high temperature as in conventional etching methods That is, when the temperature of the article to be etched is higher than 0° C., the control of the inclination angle of the side wall is very difficult even by using the above-mentioned mixed gas. Hence, it is necessary to maintain the temperature of the article to be etched at 0° C. or below. The lower limit of the temperature of the article to be etched is the condensation temperature of the gas used and naturally differs by the type of the gas used.

What is claimed is:

1. A dry etching method for selectively etching an article, wherein the article to be selectively etched, having a resist film as a mask, is placed in a reaction chamber of a dry etching apparatus; is contacted with a plasma of a gas to etch an exposed surface of the article, the gas being a mixed gas comprising (1) an etching gas and (2) a film forming gas or a surface modification gas and the temperature of the article to be etched being maintained at 0° C. or below during etching, whereby the article can be etched with a high selectivity with respect to the resist film and with a tapered sectional shape; and is selectively etched; wherein the article to be etched is silicon; wherein the mixed gas includes the film forming gas, and the film forming gas is at least one member selected from the group consisting of $CCl_4$, $CF_4$, $CHF_3$, $CHCl_3$, $SiF_4$ and $SiCl_4$; and wherein the etching gas is $SF_6$.

2. A dry etching method according to claim 1, wherein the amount of the film forming gas is 20 mol % or more.

3. A dry etching method for selectively etching an article, wherein the article to be selectively etched, having a resist film as a mask, is placed in a reaction chamber of a dry etching apparatus; is contacted with a plasma of a gas to etch an exposed surface of the article, the gas being a mixed gas comprising (1) an etching gas and (2) a film forming gas or a surface modification gas and the temperature of the article to be etched being maintained at 0° C. or below during etching, whereby the article can be etched with a high selectivity with respect to the resist film and with a tapered sectional shape; and is selectively etched; wherein the article to be etched is aluminum; wherein the mixed gas includes the film forming gas, and the film forming gas is selected from $CCl_4$ and $SiCl_4$; and wherein the etching gas is $Cl_2$.

4. A dry etching method according to claim 3, wherein the amount of the film forming gas is 5–40 mol %.

5. A dry etching method for selectively etching an article, wherein the article to be selectively etched, having a resist film as a mask, is placed in a reaction chamber of a dry etching apparatus; is contacted with a plasma of a gas to etch an exposed surface of the article, the gas being a mixed gas comprising (1) an etching gas and (2) a film forming gas or a surface modification gas and the temperature of the article to be etched being maintained at 0° C. or below during etching, whereby the article can be etched with a high selectivity with respect to the resist film and with a tapered sectional shape; and is selectively etched; wherein the article to be etched is selected from the group consisting of a tungsten film a molybdenum film, a tungsten silicide film and a molybdenum silicide film; wherein the mixed gas includes the film forming gas, and the film forming gas is $CCl_4$; and wherein the etching gas is $SF_6$.

6. A dry etching method according to claim 5, wherein the amount of the film forming gas is 5-30 mol %.

7. A dry etching method for selectively etching an article, wherein the article to be selectively etched, having a resist film as a mask, is placed in a reaction chamber of a dry etching apparatus; is contacted with a plasma of a gas to etch an exposed surface of the article, the gas being a mixed gas comprising (1) an etching gas and (2) a film forming gas or a surface modification gas and the temperature of the article to be etched being maintained at 0° C. or below during etching, whereby the article can be etched with a high selectivity with respect to the resist film and with a tapered sectional shape; and is selectively etched; wherein the resist film is a photoresist film; wherein said article is made of Si; said etching gas is $SF_6$; and said film forming gas or surface modification gas is selected from the group consisting of $CCl_4$, $CHF_3$ and $NH_3$.

8. A dry etching method for selectively etching an article, wherein the article to be selectively etched, having a resist film as a mask, is placed in a reaction chamber of a dry etching apparatus; is contacted with a plasma of a gas to etch an exposed surface of the article, the gas being a mixed gas comprising (1) an etching gas and (2) a film forming gas or a surface modification gas and the temperature of the article to be etched being maintained at 0° C. or below during etching, whereby the article can be etched with a high selectivity with respect to the resist film and with a tapered sectional shape; and is selectively etched; wherein the resist film is a photoresist film; wherein said article is made of Al; said etching gas is $Cl_2$; and said film forming gas or surface modification gas is selected from the group consisting of $SiCl_4$ and $CCl_4$.

9. A dry etching method for selectively etching an article, wherein the article to be selectively etched, having a resist film as a mask, is placed in a reaction chamber of a dry etching apparatus; is contacted with a plasma of a gas to etch an exposed surface of the article, the gas being a mixed gas comprising (1) an etching gas and (2) a film forming gas or a surface modification gas and the temperature of the article to be etched being maintained at 0° C. or below during etching, whereby the article can be etched with a high selectivity with respect to the resist film and with a tapered sectional shape; and is selectively etched; wherein the resist film is a photoresist film; wherein said article is made of W; said etching gas is $SF_6$; and said film forming gas or surface modification gas is $CCl_4$.

* * * * *